United States Patent
Hoey et al.

(10) Patent No.: US 8,322,616 B2
(45) Date of Patent: Dec. 4, 2012

(54) AUTOMATED SIGNATURE DETECTION SYSTEM AND METHOD OF USE

(75) Inventors: David W. Hoey, Rio Rancho, NM (US); Christopher T. Conley, Livermore, CA (US)

(73) Assignee: Nikon Precision Inc., Belmont, CA (US)

( * ) Notice: Subject to any disclaimer, the term of this patent is extended or adjusted under 35 U.S.C. 154(b) by 1638 days.

(21) Appl. No.: 11/678,882

(22) Filed: Feb. 26, 2007

(65) Prior Publication Data

US 2008/0086440 A1    Apr. 10, 2008

Related U.S. Application Data

(60) Provisional application No. 60/850,065, filed on Oct. 6, 2006.

(51) Int. Cl.
*G06K 7/14*    (2006.01)

(52) U.S. Cl. .......................................... 235/454; 716/51
(58) Field of Classification Search ................... 235/454; 716/51, 54
See application file for complete search history.

(56) References Cited

U.S. PATENT DOCUMENTS

| | | | |
|---|---|---|---|
| 2004/0207836 A1* | 10/2004 | Chhibber et al. | 356/237.4 |
| 2005/0071034 A1* | 3/2005 | Mitrovic | 700/121 |
| 2005/0241933 A1* | 11/2005 | Branton et al. | 204/192.34 |
| 2008/0303432 A1* | 12/2008 | Shao et al. | 313/504 |

* cited by examiner

*Primary Examiner* — Ahshik Kim
(74) *Attorney, Agent, or Firm* — Andrew M. Calderon; Roberts Mlotkowski Safran & Cole, P.C.

(57) ABSTRACT

An automated signature detection system and method of use and, more particularly, a predictive modeling component configured to accurately predict maintenance events for optical elements used in lithographic tools. The system comprises at least one module configured to analyze data associated with power illumination at a surface. The at least one module also is configured to fit a curve to the analyzed data using an exponentially based decay model.

43 Claims, 13 Drawing Sheets

AUTOMATED SIGNATURE DETECTION SYSTEM AND METHOD OF USE

CROSS REFERENCE TO RELATED APPLICATIONS

The present application claims the benefit of priority under 35 U.S.C. §119 to U.S. provisional application Ser. No. 60/850,065, filed on Oct. 6, 2006, the contents of which are incorporated herein by reference in their entirety.

FIELD OF THE INVENTION

The invention generally relates to an automated signature detection system and method of use and, more particularly, to a predictive modeling component configured to accurately predict maintenance events for optical elements used in lithographic tools.

BACKGROUND DESCRIPTION

A lithographic tool uses many components such as, for example, reticles and optical subsystems to ensure precise image transfer onto a wafer to produce a desired microelectronic device. But, the ability to produce high quality microelectronic devices and reduce yield losses is dependent upon maintaining the surfaces of critical components substantially defect-free. This would include, for example, maintaining the surfaces of the optical elements free of defects and debris which can impair the overall performance of the lithographic tool, e.g., impair illumination power of the lithography tool. This is of particular concern as finer features are required on the microelectronic device.

By way of example, a photolithography apparatus (exposure apparatus) includes an illumination system which is designed to project radiant energy (e.g., light) through a mask pattern on a reticle. By way of some examples, the illumination source can be g-line (436 nm), i-line (365 nm), KrF excimer laser (248 nm), ArF excimer laser (193 nm) or $F_2$ laser (157 nm). The projection optics (optical elements) can include, depending on the particular illumination source, glass materials (quartz and fluorite), catadioptric or refractive systems, electron lenses and deflectors.

As the illumination source projects through the optical elements, contamination may build-up on the surface of the optical elements (e.g., glass, etc.). It is theorized that the contamination build-up is due to the interaction between the optical elements and wavelength from the illumination source. One type of contamination may be bulk glass damage (e.g., decomposition) which results from very high UV exposure doses. Other types of contamination may also arise from airborne molecular contaminants that are not completely filtered from the system. Sources of airborne molecular contaminants include outgassing from resist processes or materials of construction, ambient cleanroom contamination, or from purge gas streams.

In any event, the overall power degradation could be viewed as a function of multiple contributors including, for example, thin film contamination, bulk glass damage, as well as other known or unknown contributors. This contamination absorbs illumination energy which may impede the illumination power of the illumination source at the wafer surface.

In view of the fact that the impedance of illumination power will begin to impair the performance of the lithographic tool, it is important to have stringent control of contaminant levels of the equipment environment to maximize the lifetime of the optical elements. Without such controls, there is an increase in the risk for contamination which can lead to increased equipment downtime for troubleshooting and reactive maintenance.

The monitoring of the equipment is not only a physical inspection of the systems and subsystems, but also includes the use of predictive tools, for example, to determine and predict maintenance events. The physical inspection includes sensors near the wafer to determine illumination power at the wafer surface. The predictive tools, on the other hand, use the data from the sensors to predict illumination power performance in an attempt to optimize the associated system maintenance activities related to the cleaning or replacement of the optical elements of the optical subsystems.

Currently, tools used in predicting illumination power degradation are based on linear trend models for the purpose of predicting scheduled preventive maintenance activities. In operation, such tools plot the trend data, e.g., power vs. time, for a period of time. The data is then forced into a linear fit regardless of actual signature shape in the data. This leads to inaccurate predictions and false conclusions.

As should be understood, a linear growth rate results in an exponential decay and is termed "normal degradation". However, the combined growth rate is linear only if each contributor is linear, independently. But, the combined growth rate is non-linear if just one contributor is non-linear independently. The result of a non-linear growth rate is termed "accelerating degradation" or "abnormal degradation".

By using the current linear method of predictive modeling, sudden, catastrophic failures cannot be adequately predicted. In such cases, the sudden, catastrophic failure, no matter how few, are unscheduled and can severely impact chip production, i.e., significantly impairs chip yield. Also, such known predictive modeling techniques may lead to premature or inaccurate performance threshold reach dates resulting in premature maintenance based on a linear model. This too can significantly impair chip yield. Additionally, known predictive modeling cannot distinguish between normal and abnormal degradation and may miss indicators of potential tool issues such as low rate with high acceleration.

Accordingly, there exists a need in the art to overcome the deficiencies and limitations described hereinabove.

SUMMARY OF THE INVENTION

In a first aspect of the invention, a subsystem for an apparatus, comprises at least one module configured to analyze data associated with power illumination at a surface, and make predictions based on a fitted curve of analyzed data using an exponentially based decay model.

In embodiments of the first aspect, the exponential based decay model is a non-linear model. The exponentially based decay model establishes predictions from actual mathematical trends. The at least one module decides which prediction equation to use based on a signature shape of the analyzed data. The at least one module is configured to provide a display of the curve. The at least one module provides advanced notice for parts acquisition, advance notice to schedule recovery tasks and/or proactive and data driven recovery of optical elements of a lithographic tool based on a slope of the curve.

In still further embodiments of the first aspect of the invention, the at least one module includes computer code stored in at least one of internally in the at least one module, temporarily or permanently in a memory and storage system. The at least one module is configured to transmit at least the data associated with the curve over a network. The at least one module is configured to determine an accelerated degradation of power illumination of a lithographic tool based on a shape of the curve. The exponentially based decay model is defined initially as:

$$P_f = P_o e^{\beta(x[t])}$$

where, $P_f$ is defined as a final power, $P_o$ is defined as an initial power, $\beta(x[t])$ defines an exponential growth term where $\beta$ defines a constant attenuation coefficient and x[t] defines an accumulation as a function of an independent variable t. The exponentially decay model will result in the following derivations:

(i) transmitted power in (mW) at any point along a trend by:

$$P_f = P_o e^{(C+\alpha_o p + 1/2\alpha' p^* p)}$$

(ii) power rate in (mW/BP) at any point along the trend by:

$$P_f' = P_f(\alpha_o + \alpha' p)$$

(iii) power acceleration (mW/BP²) at any point along the trend by:

$$P_f'' = P_f(\alpha_o^2 + \alpha' + 2\alpha_o \alpha' p + \alpha'^2 p^2).$$

In further embodiments, when power (mW) is plotted against pulse count (BP), the acceleration expressed in units of (mW/BP²) is normally positive and is representative of normal degradation of an optical element. Normal degradation results in a curve which assumes an upwardly facing concave shape. Accelerating or abnormal degradation results in a linear or downwardly facing concave shape. The analyzed data associated with power illumination at a surface is a region of power vs. pulse count data. The at least one module is configured to remove discontinuities over the region to produce a smoothed dataset and uses the smoothed dataset to determine point to point slopes resulting in average ("constant") acceleration rate ($\alpha'$) over the region and average loss rate ($\alpha_{average}$) at a mid-point of a pulse range. The at least one module calculates a take-off rate ($\alpha_o$) at a final pulse in the data using the exponentially based decay model. The current prediction model assumes a constant acceleration ($\alpha'$) to calculate the take-off rate ($\alpha_o$).

$$\alpha_o = \alpha_{average} + \alpha'(p_{last} - p_{first})/2$$

The at least one module further calculates a number of additional pulses (p) by:

$$P_f = P_o e^{(\alpha_o p + 1/2\alpha' p^* p)}$$

The exponentially based decay model is used to calculate an acceleration of degradation of an optical element.

In a second aspect of the invention, a method for predicting degradation issues with an optical system is provided. The method includes providing a computer infrastructure being operable to: analyze region of power vs. pulse count data; remove discontinuities over the region to produce a smoothed dataset; determine point to point slopes of the dataset; and calculate a take-off rate ($\alpha_o$) at final pulse in the dataset.

In yet another aspect, the method of predicting degradation of an optical element includes analyzing data associated with power illumination over a predetermined period of time. The method further includes modeling the analyzed data using a non-linear modeling technique, and displaying results of the modeling on a display.

In still another aspect of the invention, an exposure apparatus comprises an optical subsystem for image transfer of radiant energy from an illumination system onto a wafer to produce a desired microelectronic device. A sensor is provided to detect power illumination at a surface of the wafer. At least one module is configured to analyze data associated with the power illumination, and to fit a non-linear curve to the analyzed data to obtain predictive information.

BRIEF DESCRIPTION OF THE DRAWINGS

The foregoing and other aspects and advantages will be better understood from the following detailed description of embodiments of the invention with reference to the drawings, in which.

DETAILED DESCRIPTION OF EMBODIMENTS OF THE INVENTION

The invention is directed to an automated signature detection system and method of use and, more particularly, to a tool configured to accurately predict maintenance events for optical elements used in lithographic tools. In embodiments, the system and method of the invention is configured to predict early detection of atypical power performance issues for preventive maintenance activities related to cleaning and/or replacement of optical elements in a lithographic tool. The system and method of the invention more accurately predicts events than when using linear modeling techniques. The system and method of the invention is configured and capable of predicting catastrophic failures of the lithographic tools, as well as to improve the design and/or manufacturing of various optical elements, using its predictive modeling techniques.

The ability to detect otherwise unforeseen failures serves as an early warning system for optic failure, thereby allowing time to proactively develop recovery plans and minimize the associated down-time implications of the lithographic tool. This will allow the customer to more accurately plan and schedule preventative maintenance before the chip yield is affected thus reducing reworks and unscheduled downtime. Thus, the intelligent signature detection provided by the system and method of the invention equips the user to better support lithographic tools through the ability to more fully predict the future of the lithographic tools' illumination power performance. In this manner, there will be an increase in lithographic tool availability for the customer and a positive impact to overall cost of ownership (COO) of the lithographic tool. Also, by using the system and method of the invention, both early detection of optics failures and better accuracy in predicting low performance reach dates can be achieved, thus allowing field service to better judge required resources, i.e., parts, tooling, expertise, and procedures in a timely manner.

In embodiments, the system and method of the invention establishes predictions from actual mathematical trends. The predictions may be based on an exponentially based decay model (equation) or, alternatively, the prediction tool intelligently decides which prediction equation to use based on a signature shape of the data. (See, for example, the flow diagrams of FIGS. 8 and 9.) Thus, in the latter embodiment, for example, normal and abnormal degradation signatures can be established for any given lithographic tool type using various decay models. Since normal power degradation is most likely driven by thin film contamination (in addition to or alternatively with other degradation issues) of optical elements, the prediction model can closely match the physical contamination model.

System Environment

Figure 1:
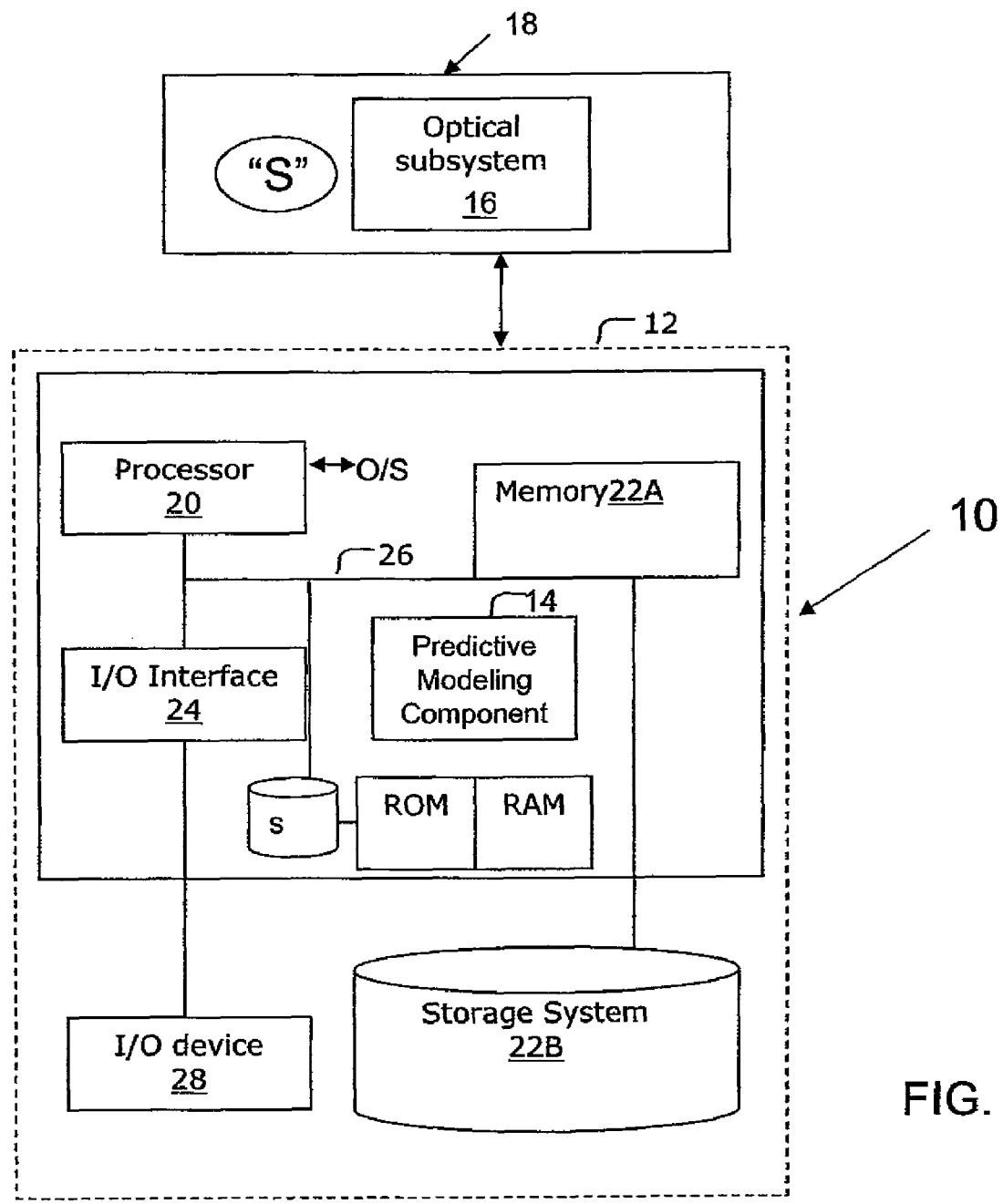
FIG. 1 shows a diagram of an embodiment in accordance with the invention.

FIG. 1 shows an illustrative environment 10 for managing the processes in accordance with the invention. The environment may be a server or a user workstation, for example. The environment 10 includes a computing device 12 which includes a predictive modeling component (module) 14 configured to predict maintenance events for optical elements 16 used in a lithographic tool 18.

In one embodiment, the predictive modeling component 14 uses data obtained from monitoring devices such as, for example, known sensors "S" to predict the illumination performance of the optical elements 16 of the lithographic tool 18 (e.g., photolithography, etc.). The data, in embodiments, is illumination power as measured at the wafer surface. The predictive modeling component 14, as described above, uses the data to more accurately chart predictions of illuminator performance such that preventative maintenance tasks required to maintain optimum performance can be performed and occurrences of unscheduled downtime due to both typical and atypical optical elements' performance can be minimized. Moreover, the predictive modeling component 14 is configured to provide advanced notice for parts acquisition, more time to schedule recovery tasks and/or proactive and data driven recovery of the optical elements 16 of the lithographic tool 18.

The programming code of the predictive modeling component 14 may be stored internally in the component 14, itself, or temporarily or permanently in a memory 22A or storage system 22B. As discussed in greater detail below, the program code is configured to implement the processes described herein. The memory 22A can include local memory employed during actual execution of the program code, bulk storage, and/or cache memories.

The computing device 12 further includes a processor 20, an input/output (I/O) interface 24, a bus 26, Storage "S", ROM, RAM and an external I/O device/resource 28. The external I/O device/resource 28 may be a keyboard, display, pointing device, or any device that enables communication with the computing device 12. The display, for example, can provide graphical information to the user, as well as user inputs. In embodiments, the processor 20 executes the computer program code of the predictive modeling component 14. While executing the program code, etc., the processor 20 can read and/or write data to/from the memory 22A, storage system 22B, and/or I/O interface 24. The bus 26 provides a communications link between each of the components in the computing device 12.

In embodiments, the computing device 12 may be in communication with other, remote computing devices (not shown) via any known communications link such as, for example, the Internet, World Wide Web based applications, a wide area network, a local area network, a virtual private network, etc. In other implementations, the computer program code of the predictive modeling component 14 may be implemented on site, or remotely via the communications link. Analysis, accordingly, can be performed at the customer site (at the location of the lithographic tool) or remotely and provided via a web interface. If the analysis is performed remotely, any maintenance information can then be transmitted to the customer site.

In further implementations, the invention can take the form of an entirely hardware embodiment, an entirely software embodiment or an embodiment containing both hardware and software elements. In the case of a software embodiment, the software elements may reside in internal memory of the predictive modeling component 14 or within memory 22A or storage 22B.

In use, the predictive modeling component 14 automatically predicts an actual shape of a trend signature based on optical transmission theory, as opposed to forced linear trending of all data. This provides early warning of optics' failures based on signature detection, more accuracy in predicting low performance reach dates and troubleshooting power degradation issues. In implementation, the detection of a signature is fully automated.

Embodiments of Invention

Figure 2:
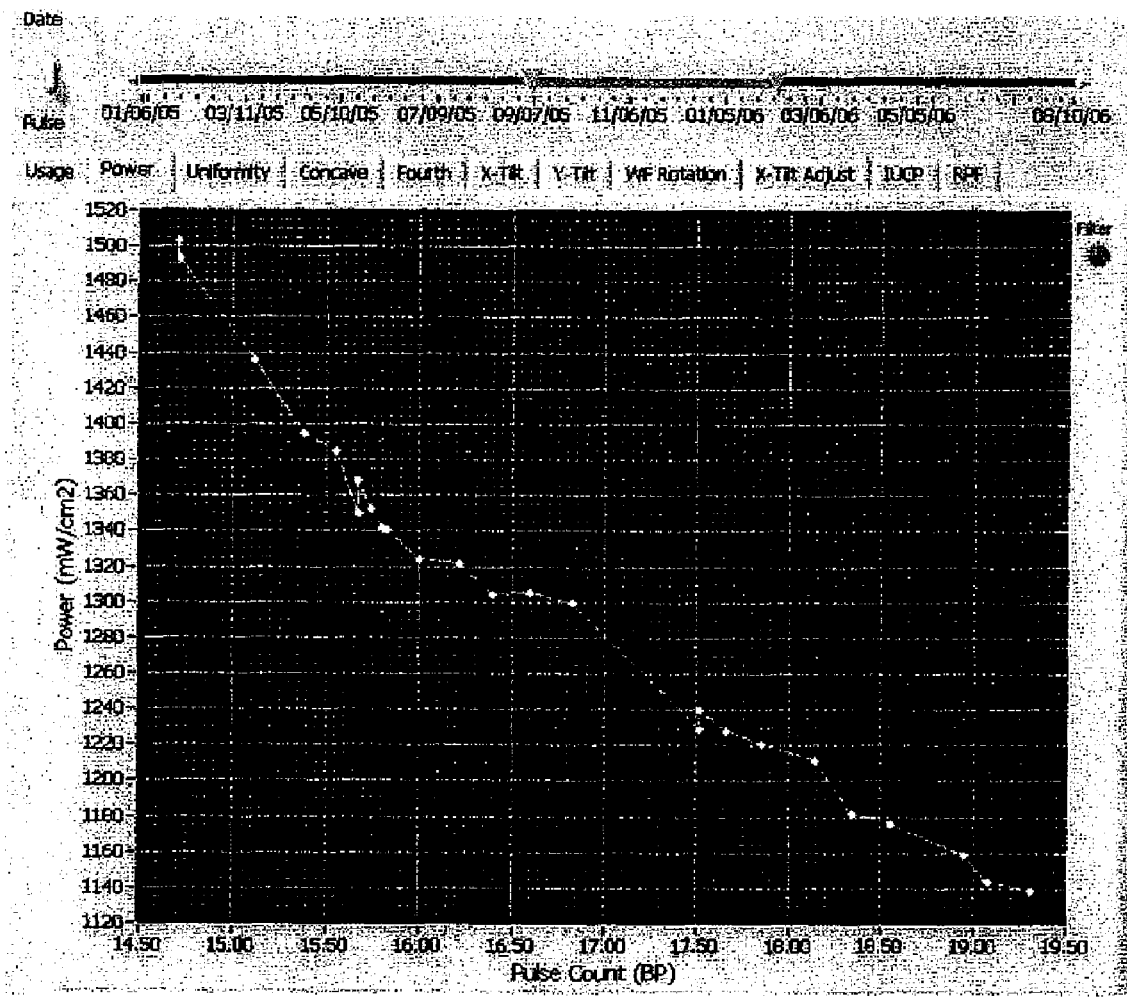
FIG. 2 shows a graph of normal expected behavior, implemented in accordance with the invention.

FIG. 2 shows a graph of normal expected behavior, implemented in accordance with the invention. In accordance with the invention, the normal power performance of the lithographic tool 18 is established based on the routine behavior of the lithographic tool 18. The graph of FIG. 2 is plotted as power (mW/cm$^2$) vs. time (pulse count per billion). This normal behavior can be used as a base line behavior as discussed in more detail below.

In general, the normal expected behavior is based on an exponential decay model assuming a linear growth rate of all degradation contributors combined. A linear growth rate results in a non-exponential decay only if each contributor is linear, independently ("normal degradation"). However, in cases where one or more of the contributors is not linear, a non-linear growth rate may result ("accelerating degradation"). In either a normal or accelerated degradation situation, in accordance with the invention, the exponential decay model (non-linear), as shown representatively in FIG. 2, graphically shows that the trend can be accurately predicted thus minimizing downtime of the machine due to, for example, premature maintenance or catastrophic failures.

In accordance with the invention, power illumination along any point along a trend (signature) can be plotted using an exponential decay using the following general equation:

$$P_f = P_o e^{\beta(x[t])} \quad (1)$$

where, $P_f$ is defined as the final power, $P_o$ is defined as the initial power, $\beta$ defines a constant attenuation coefficient and x(t) defines an accumulation as a function of some independent variable t. Also, the exponent, $\beta x(t)$, is defined as the exponential growth term.

The above equation (1) may be used to plot the expected behavior of the lithographic tool in accordance with the invention. That is, equation (1) can be used to define power loss due to an accumulation (e.g., damage or contamination) on the optical elements of the lithographic tool. As fully set forth herein, this can be used to accurately predict accelerations of optical degradation (e.g., future catastrophic events), and hence time frames for preventative maintenance (regardless of normal or accelerated degradation situations).

In accordance with the invention, as shown herein, the exponential (growth) term can be expanded, assuming that the accumulation rate "x" remains constant.

$$Growth = \beta \int\!\!\int x'' dt\, dt;$$

$$Growth = \beta \int (x''t + x') dt;\ \text{and}$$

$$Growth = \beta(x_o + x_o't + \tfrac{1}{2}x''t^2),$$

where, $x_o$ is the initial accumulation, which may be defined as any initial contamination on the optical elements such as, for example, thin film deposition, bulk glass damage, etc. $x_o'$ is the initial accumulation rate (dx/dt), which may be defined how fast the change in contamination is occurring on the optical elements, and x" is the acceleration of accumulation rate ($d^2x/dt^2$). It should be understood that "t" is an independent variable denoting one of several independent variables.

In accordance with the invention, the following are exponential (growth) rate possibilities using growth=$\beta(x_o+x_o't+\frac{1}{2}x''t^2)$.

|  | Attenuation Coefficient | Initial Accumulation (Acc.) | Initial Acc. Rate | Acc. Acceleration | Independent Variable |
|---|---|---|---|---|---|
| Definition of β | β | $x_o$ | $x_o'$ | x" | t |
| Monitored loss rate through system | 1 | Constant | 1/BP | $1/BP^2$ | BP |
| Loss rate due to undamaged glass | 1/um | um | um/month | $um/month^2$ | month |
| Loss rate due to damaged glass | 1/um | um | um/BP | $um/BP^2$ | BP |
| Loss rate due to damaged glass | 1/um | um | um/MJ | $um/MJ^2$ | MJ |
| Loss rate due to thin film deposition | 1/um | um | um/month | $um/month^2$ | month |

The equation "Growth=$\beta(x_o+x_o't+\frac{1}{2}x''t^2)$" can be transformed using the following substitutions.

|  | Attenuation Coefficient | Initial Accumulation | Initial Accumulation Rate | Accumulation Acceleration | Independent Variable |
|---|---|---|---|---|---|
| Definition of β | β | xo | $x_o'$ | x" | t |
| Monitored loss rate through system | 1 | Constant (C) | 1/BP ($\alpha_o$) | 1/BP2 ($\alpha'$) | BP (p) |

These substitutions result in the following equation (2).

$$Growth = (C + \alpha_o p + \frac{1}{2}\alpha' p^2) \quad (2)$$

It is noted that $\alpha_o$ is the initial attenuation rate and $\alpha'$ is the acceleration of the attenuation rate. (Also, it is noted that $p^2=p*p$.) By making substitutions, the transmitted power at any point along a trend can be defined with the following equation.

$$P_f = P_o e^{(C+\alpha_o p + 1/2\alpha' p*p)} \quad (3)$$

By expanding equation (3), it is possible to obtain the power rate at any point along the trend, as shown in equation (4), below.

$$P_f' = P_f(\alpha_o + \alpha' p) \quad (4)$$

It should be understood that equation (4) is the derivative of $P_f$ with respect to pulse count, p. Power rate is normally negative.

Equation (4) can be further expanded to provide power acceleration at any point along the trend, as shown in equation (5) below.

$$P_f'' = P_f(\alpha_o^2 + \alpha' + 2\alpha_o \alpha' p + \alpha'^2 p^2) \quad (5)$$

It should be understood that equation (5) is the second derivative of $P_f$ with respect to pulse count, p. The acceleration is normally positive and is representative of an acceleration of the degradation of the optical elements, whether from bulk glass damage, contamination or other unknown component.

Figure 3:
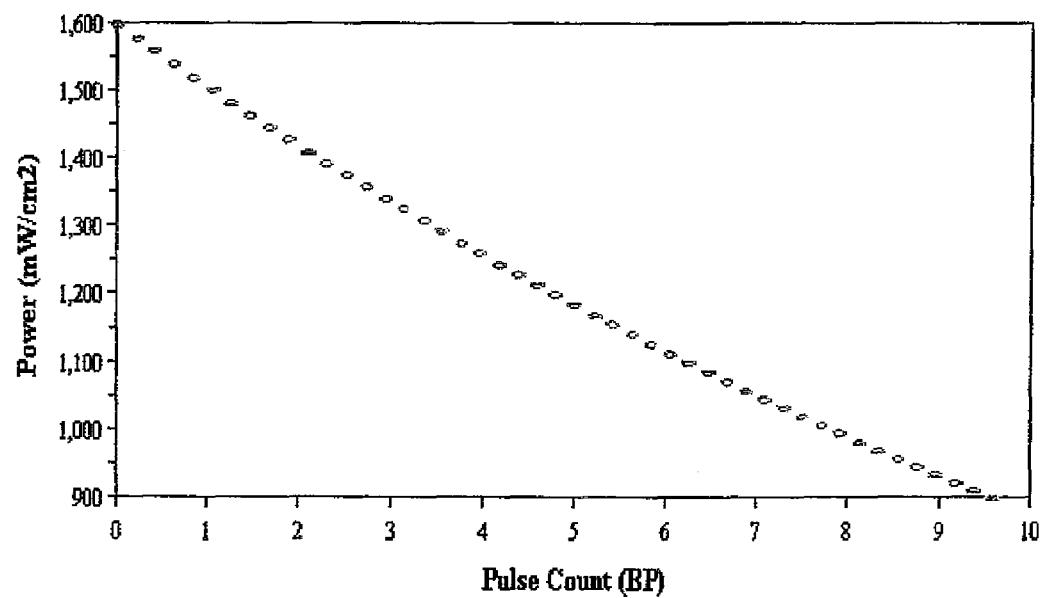
FIG. 3 illustrates a graph showing a power loss due to a linear growth rate, plotted in accordance with the invention.

FIG. 3 illustrates a graph showing a power loss due to a linear growth rate, plotted in accordance with the invention. The graph of FIG. 3 assumes acceleration of degradation, $\alpha'$, is 0 and $\alpha$ is −0.06/BP. As seen in the graph of FIG. 3, the signature results in a slightly upwardly facing concave curve.

Figure 4:
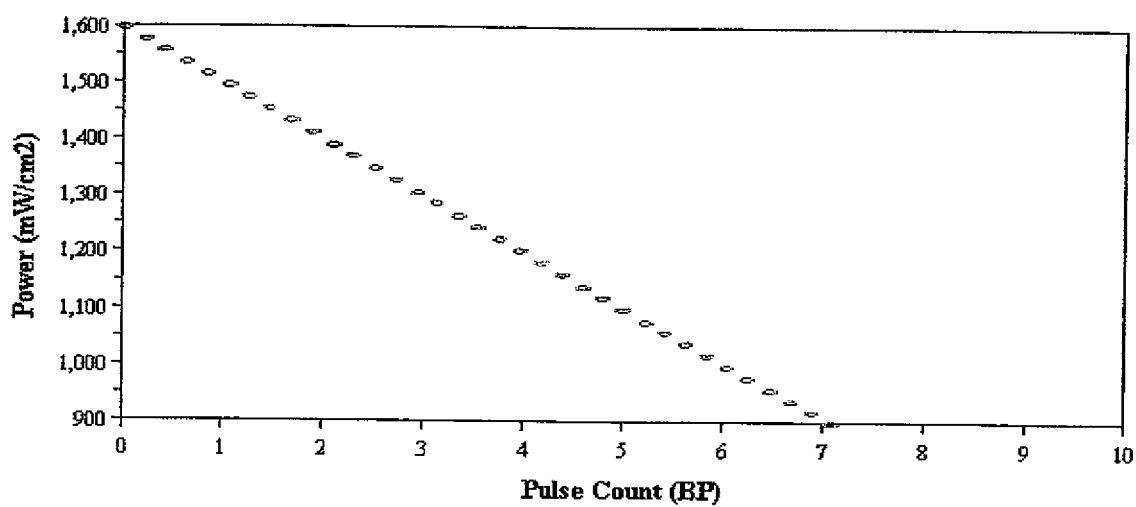
FIG. 4 illustrates a graph showing a power loss due to a slightly accelerated growth rate in the accumulation (e.g., damage or contamination), plotted in accordance with the invention.

FIG. 4 illustrates a graph showing a power loss due to a slightly accelerated growth rate in the accumulation (e.g., damage or contamination), plotted in accordance with the invention. The graph of FIG. 4 assumes acceleration of degradation, $\alpha'$, is −0.006 $BP^2$ and $\alpha$ remains at −0.06/BP. As seen in the graph of FIG. 4, the signature results in a constant slope.

Figure 5:
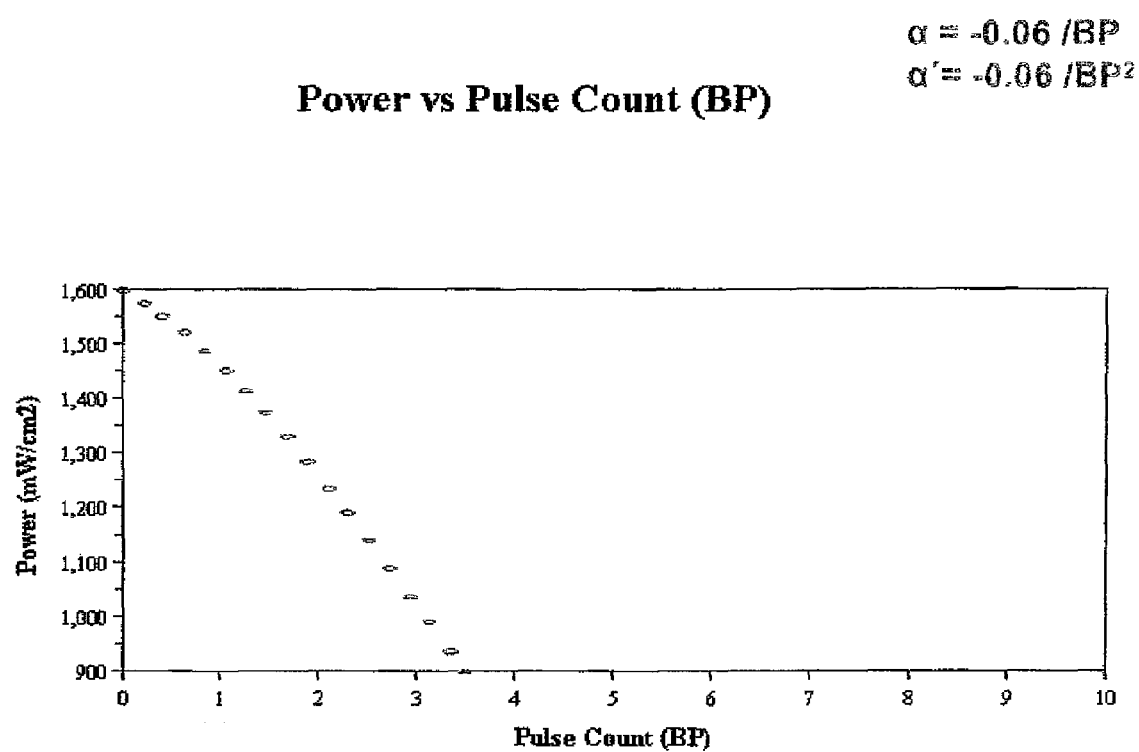
FIG. 5 illustrates a graph showing a power loss due to an accelerated growth rate, plotted in accordance with the invention.

FIG. 5 illustrates a graph showing a power loss due to an accelerated growth rate, plotted in accordance with the invention. The graph of FIG. 5 assumes acceleration of degradation, $\alpha'$, is −0.06$BP^2$ and $\alpha$ is −0.06/BP. Compared to FIG. 4, the acceleration of degradation, $\alpha'$, is −0.06$BP^2$ used for charting FIG. 5 is greater than that of FIG. 4. For this reason, as shown in the graph of FIG. 5, the signature results in a downwardly facing concave curve. This shows a rapid or accelerated degradation of the optical elements.

Figure 6:
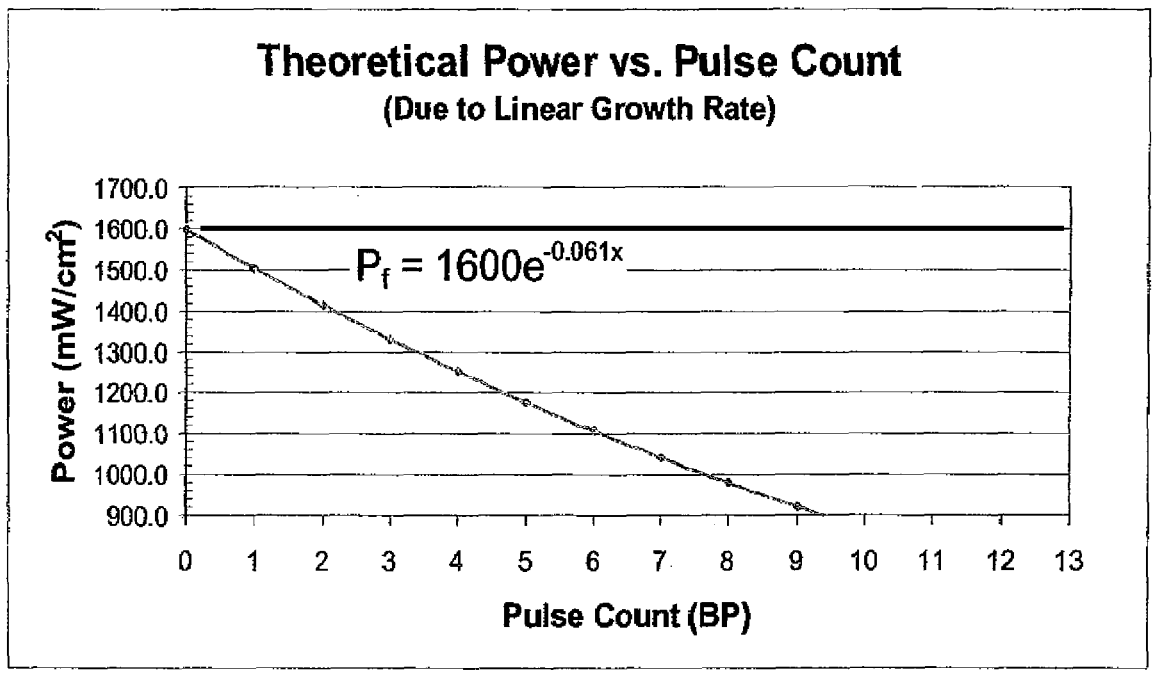
FIG. 6 illustrates power loss due to a linear growth rate using a theoretical power versus pulse count (in billions)

FIG. 6 illustrates power loss due to a linear growth rate using a theoretical power versus pulse count (in billions). The graph of FIG. 6 may be plotted using equation (1) and its derivatives. In this example, $\alpha$ is set at −0.061, which is a typical value for a lithographic tool. However, those of skill in the art should understand that the value of −0.061 may be different, depending on the trend line of the analyzed data. Also, acceleration is assumed to be 0 and $P_o$e is set at 1600. As shown in the graph of FIG. 6, the power decay is approximately 6.1%. In this example, the growth rate shows a normal decay thus showing a slightly concave upwardly facing curve using the modeling technique of the present invention.

As described above, a substantially linear growth rate results in a non-exponential decay ("normal degradation"); whereas, a combined growth rate may result in an exponential decay ("accelerating degradation"). However, using the processes described herein, a non-linear curve can be fit to the data points, resulting in more accurate predictions as seen in FIGS. 4-6, for example.

Figure 7A:
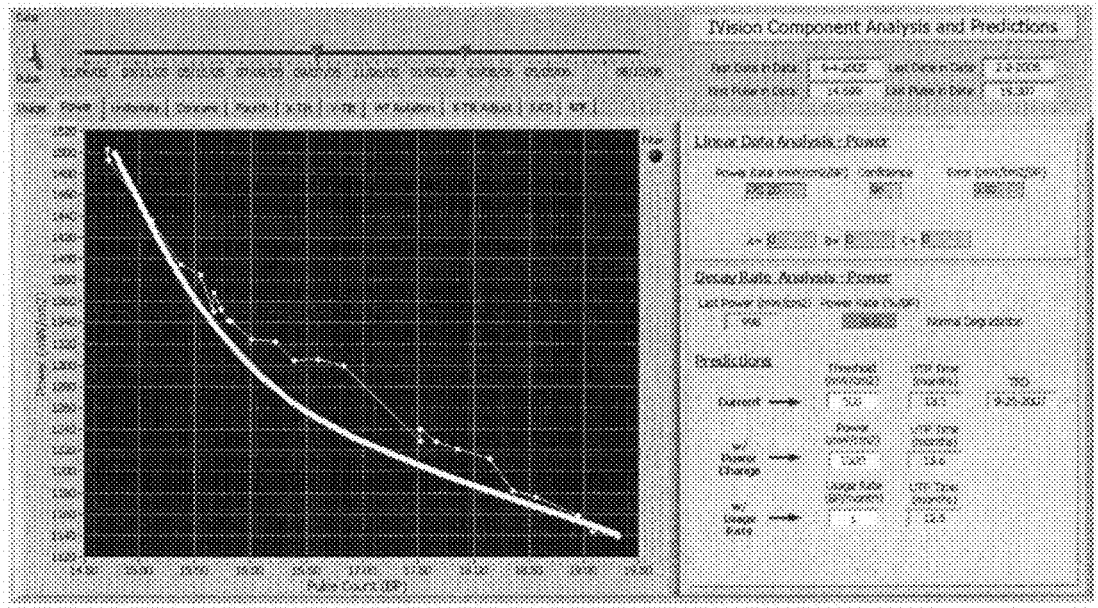
FIGS. 7A and 7C show an illustrative comparison of displays (screen shots) between a "normal degradation" curve and an "accelerating degradation" curve, as plotted using the method and system of the invention.
Figure 7C:
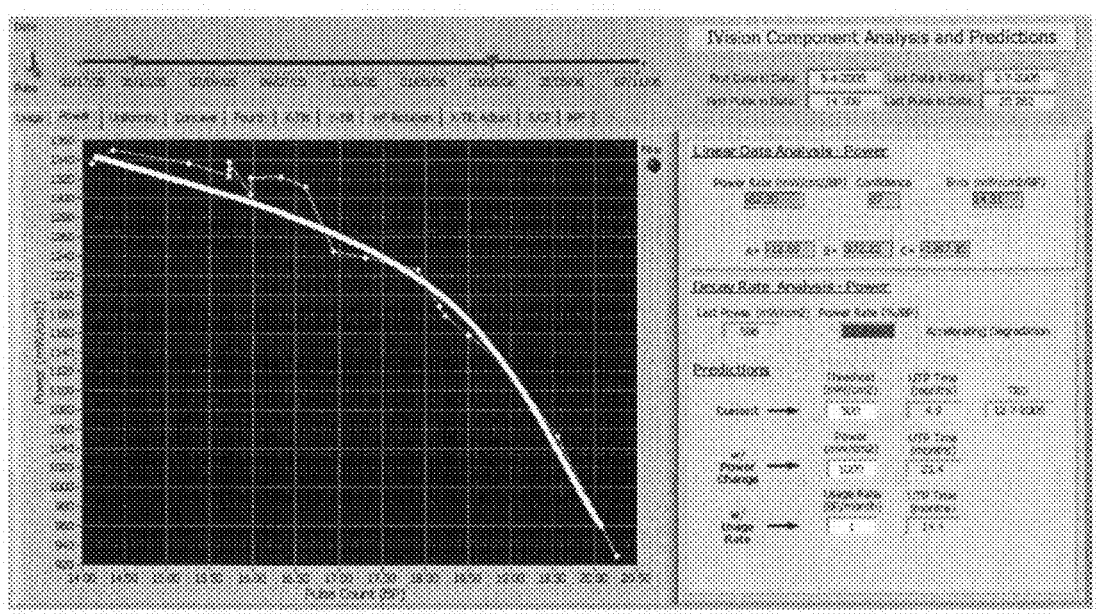
Figure 7B:
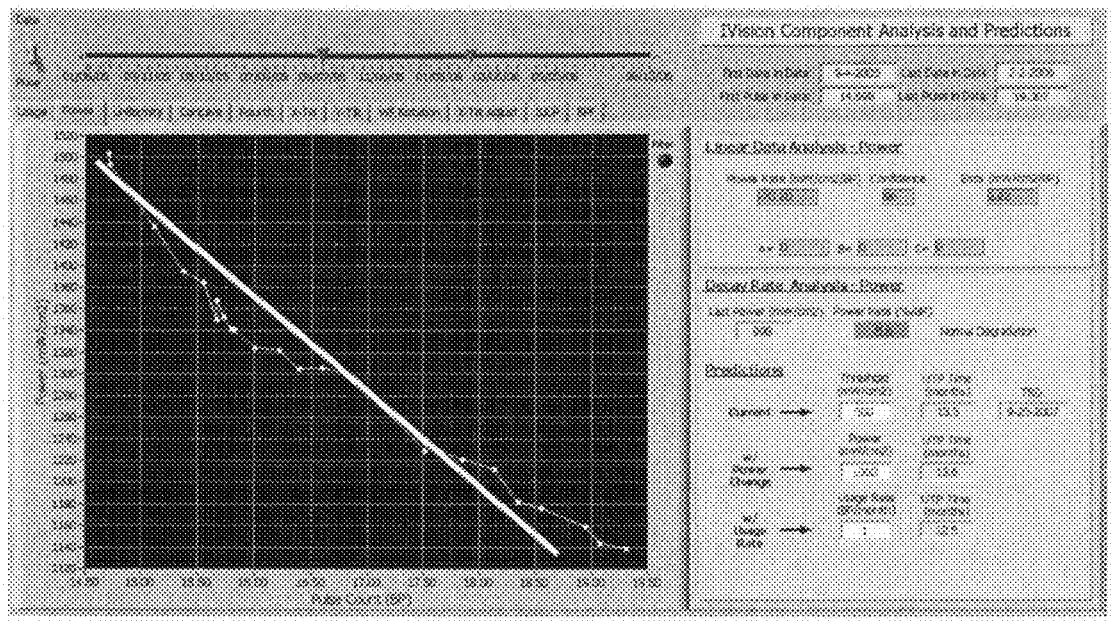
FIGS. 7B and 7D show an illustrative comparison of displays (screen shots) with respect to FIGS. 7A and 7C using a linear modeling technique resulting in a straight line graph.
Figure 7D:
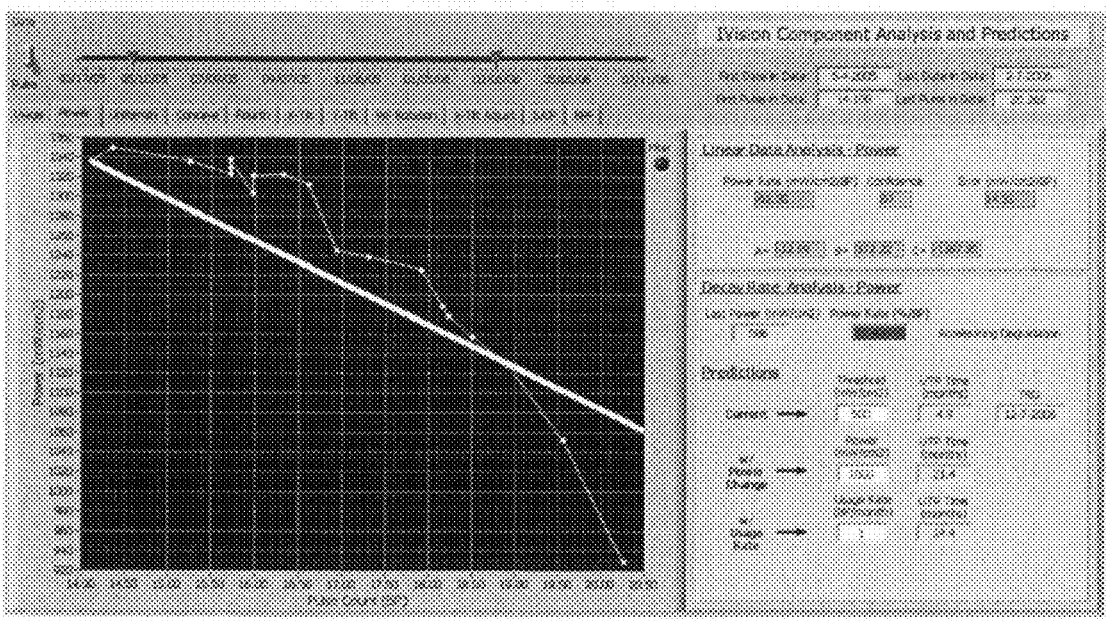

FIGS. 7A and 7C show an illustrative comparison (depicted as screen shots) between a "normal degradation" curve and an "accelerating degradation" curve, as plotted using the method and system of the invention. FIGS. 7B and 7D, on the other hand, show an illustrative comparison (depicted as screen shots), respectively, using a linear modeling technique resulting in a straight line graph.

FIG. 7A shows a normal degradation as a concave upwardly facing curve (signature). In accordance with one aspect of the invention, the date predictions for maintenance can be based on an exponential fit. However, as shown in FIG. 7C, an accelerating degradation is shown as a concave downwardly facing curve (signature). In accordance with one aspect of the invention, the date predictions for maintenance of an accelerating degradation are based on a polynomial fit (as discussed with reference to FIG. 9). It should be understood that the curve of FIG. 7C shows a rapid decay in performance, probably due to an unexpected catastrophic event.

Thus, in accordance with the invention, trending can now be based on actual shape of degradation signature by initially including higher order coefficients in trend lines leading to several possible shapes. In this way, a linear degradation of illumination power would show a constant slope (mW/cm²/BP), a normal degradation of illumination power would show a slope trending positive through time (e.g., concave upwardly facing curve) and an accelerating degradation of power illumination would show a slope trending more negative through time (e.g., concave downwardly facing curve). Thus, using the method and system of the invention it is now possible to define the actual performance of any given lithographic tool at any given time without predetermining the shape of the degradation signature.

Using the same data as FIGS. 7A and 7C, implementing a linear modeling technique (compared with that of the present invention) would result in a straight line graph as shown in of FIGS. 7B and 7D, respectively. This would result in an incorrect or inaccurate prediction. In FIG. 7B, for example, the prediction would result in premature maintenance. On the other hand, in FIG. 7D, the linear modeling technique would not predict the sudden, catastrophic failure. In both instances, the linear modeling technique results in an unscheduled downtime that severely impacts chip production, i.e., significantly impair chip yield.

Methods of Use

Figure 8:
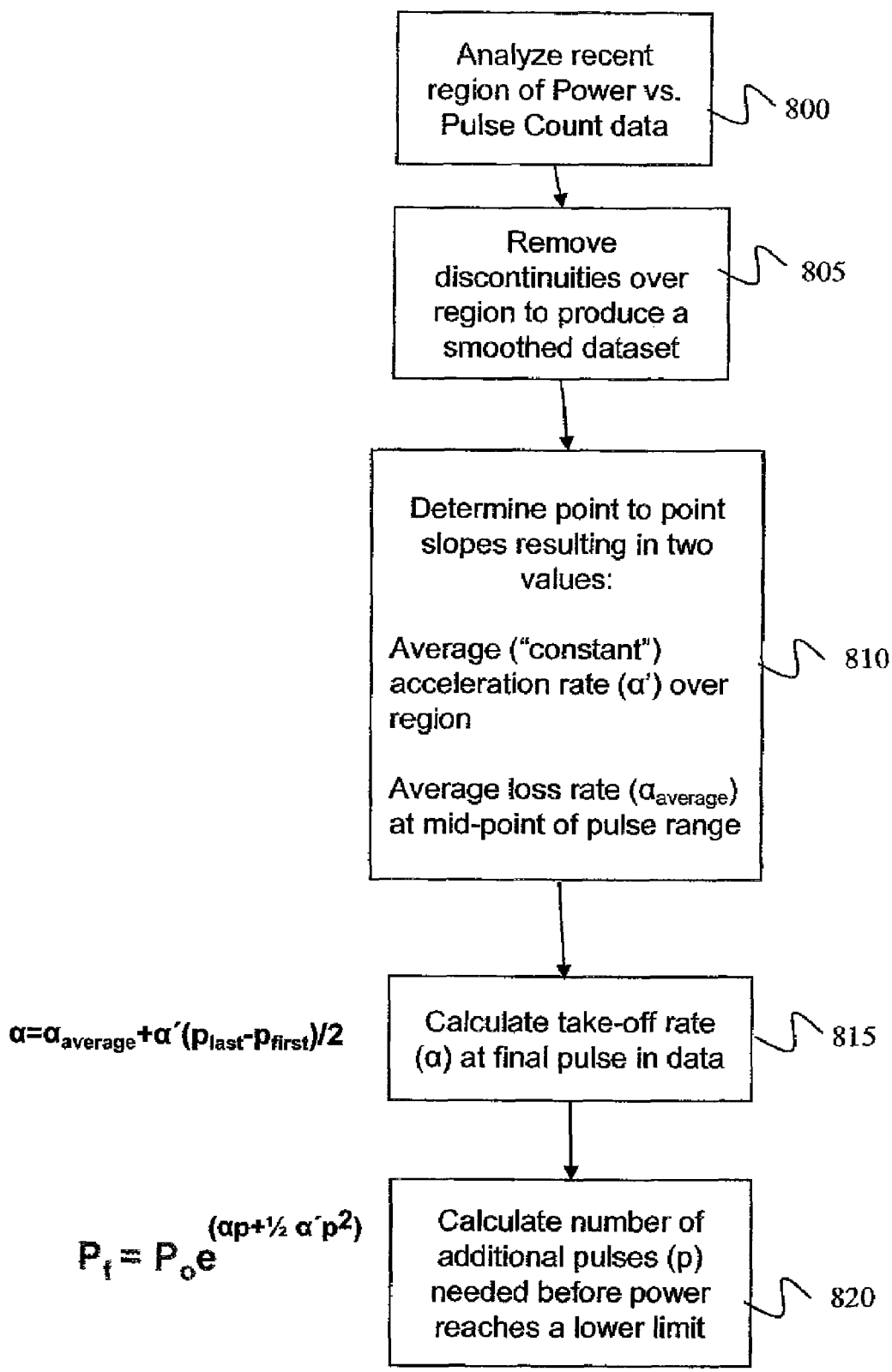
FIGS. 8 and 9 show illustrative flow diagrams implementing steps of the invention.
Figure 9:
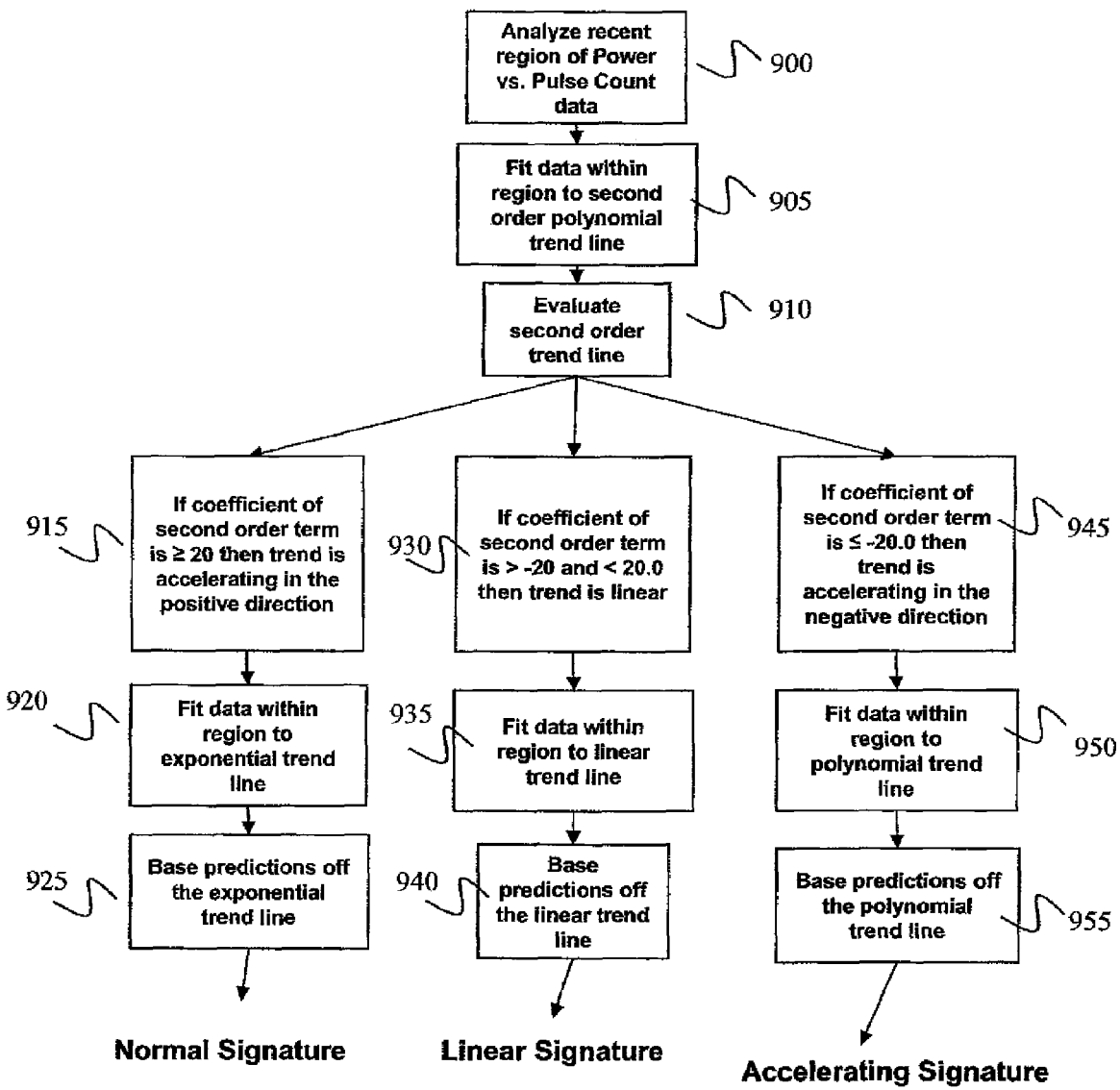
Figure 10:
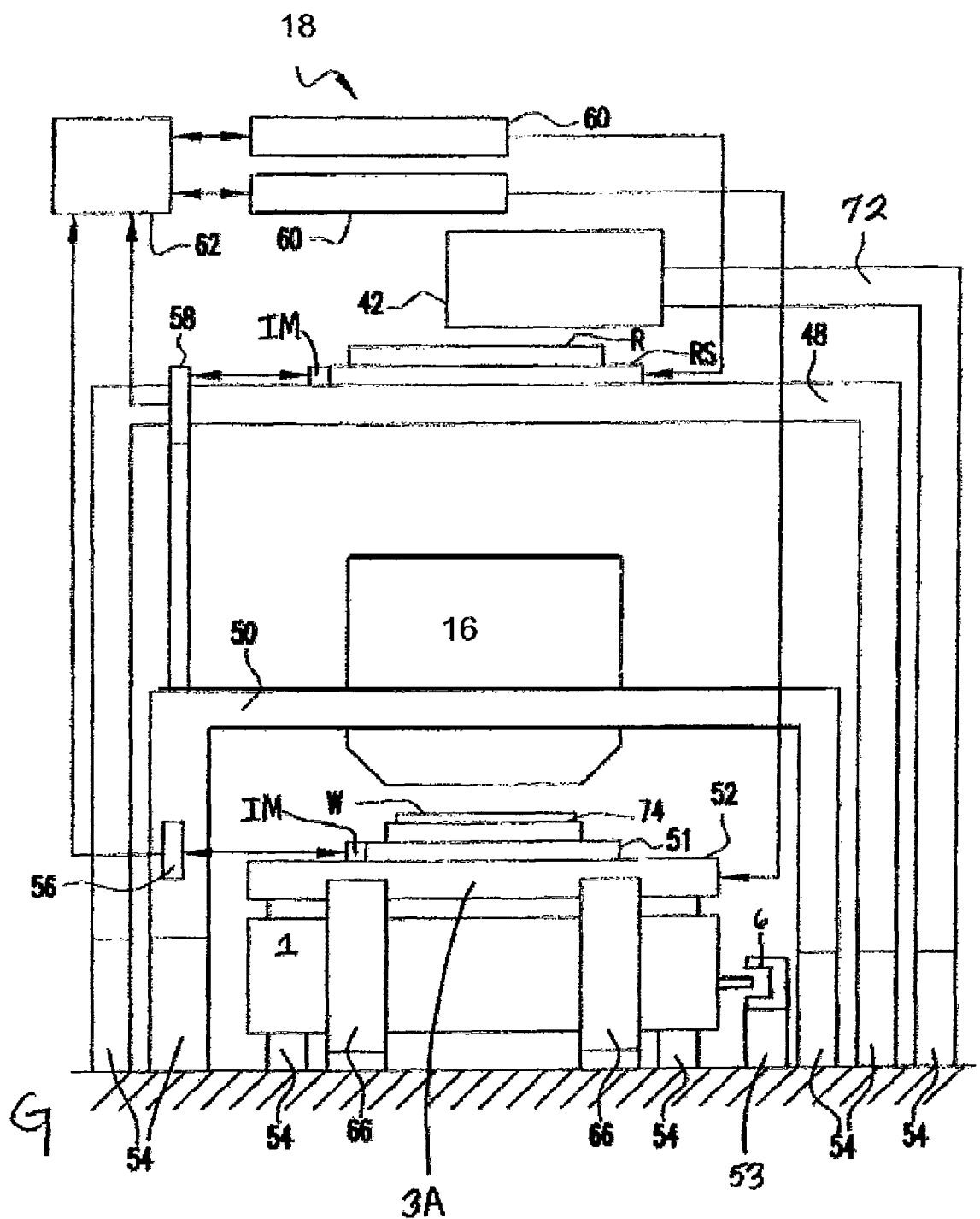
FIG. 10 is a schematic view illustrating a photolithography apparatus (exposure apparatus) which can be used to implement the system and method of the invention.

FIGS. 8 and 9 show illustrative flow diagrams implementing steps of the invention. FIGS. 8 and 9 may equally represent a high-level block diagram of the invention. The steps of FIGS. 8 and 9 (and any other processes described herein) may be implemented and executed from the environment shown in FIG. 1, which may be a server or a user workstation. Additionally, the invention can take the form of an entirely hardware embodiment, an entirely software embodiment or an embodiment containing both hardware and software elements.

Referring to FIG. 8, at step 800, the process analyzes the recent region of power vs. pulse count data. For example, the process of the invention may analyze illumination power of the lithographic tool over a predetermined amount of time (e.g., 6 months of data). At step 805, the process removes discontinuities over the region to produce a smoothed dataset. At step 810, the process determines point to point slopes resulting in two values: average ("constant") acceleration rate ($\alpha'$) over region and average loss rate ($\alpha_{average}$) at mid-point of pulse range. At step 815, the take-off (acceleration) rate ($\alpha$) will be calculated at final pulse in the data. In this step, the take-off rate can be calculated using $\alpha = \alpha_{average} + \alpha'(p_{last} - p_{first})/2$. At step 820, a number of additional pulses (p) needed before power reaches a lower limit is calculated. In one embodiment, the number of additional pulses (p) can be calculated by $P_f = P_o e^{(\alpha' p + 1/2\alpha' p \ast p)}$.

FIG. 9 is an alternative method of predicting the maintenance requirements of the lithographic tool. Much like that described above, the processes of FIG. 9 result in a linear trend line, a slightly upwardly facing concave curve or a downwardly facing concave curve, depending on the analyzed data In implementation, using the processes of FIG. 9, the upwardly facing concave curve is trended using the equations discussed above; whereas, the downwardly facing concave curve is trended using a polynomial equation, as discussed below, and linear curve may be trended using linear modeling techniques (or the equations discussed above). Thus, in operation, the processes of the invention are configured, in the embodiment of FIG. 9, to intelligently decide which prediction equation to use based on a signature shape of the data.

Referring to FIG. 9, at step 900, the process analyzes the recent region of power vs. pulse count data. For example, the process of the invention may analyze data for a predetermined time (e.g., 6 months of data). At step 905, the process of the invention uses the analyzed data to fit within a second order polynomial trend line (e.g., $ax^2 + bx + c$, where "a" correlates to the acceleration of degradation of the optical elements, "b" is the slope and "c" is the y intercept). At step 910, the trend line is evaluated. For example, (i) if the coefficient of the second order term is $\geq 20$ then the trend is going in the positive direction (step 915) (normal signature);

(ii) if the coefficient of second order term is $>-20$ and $<20.0$ then the trend is linear (step 930) (linear signature); and (iii) if the coefficient of the second order term is $\leq -20.0$ then the trend is accelerating in the negative direction (step 940) (accelerating signature).

It should be noted that the value of "20" is used herein based on experimental data which shows that a value of less than 20 will result in a fairly straight line. However, those of ordinary skill in the art should understand that a number greater or less than 20 is contemplated within the scope of the invention the invention.

If, at step 915, the coefficient of the second order term is $\geq 20$, then, at step 920, the data is fit within the region to the exponential trend line. In such a scenario, the predictions are made from the exponential trend line at step 925. In this illustrative example, using the equation (5), for example, a slightly concave upwardly facing curve is provided to show the "normal degradation."

If, at step 930, the coefficient of second order term is >−20 and <20.0 then, at step 935, the data is fit within the region to the linear trend line. In such a scenario, the predictions are made from the linear trend line at step 940. In this case, there is no need to focus on the exponential decay using, for example, the above noted exponentially based equations, since the acceleration will be 0. For this reason, a linear trend line will result.

If, at step 945, the coefficient of the second order term is ≦−20.0 then, at step 950, the data is fit within the region to the polynomial trend line. In such a scenario, the predictions are made from the polynomial trend line at step 945.

In view of the above, it should now be understood that, in implementing the present invention, rate is defined as change of power vs. pulse count. The different signature shapes (e.g., upwardly or downwardly facing concave curve) may have the same overall slope; however, it is now possible to more accurately predict maintenance issues with the lithographic tool. In embodiments, it is now possible to analyze the signature to include at least acceleration ($2^{nd}$ order derivative as shown in equation (5)), which is defined as change of rate vs. pulse count. It is also possible to describe the overall signature shape, which can be used to determine a normal degradation curve as well as an accelerating degradation curve. In the latter scenario, the system and method of the invention is capable of accurately characterizing rapidly degrading performance of the lithographic tool. This latter feature allows the user to attend to the lithographic tool prior to such failure thus reducing unscheduled down time. The system and method of the invention can also consider "jerk", which is defined as change of acceleration vs. pulse count. The jerk is a third order derivative of equation (1).

Illustrative Lithography Apparatus

FIG. 9 is a schematic view illustrating a photolithography apparatus (exposure apparatus) 18 which can be used to implement the system and method of the invention. In embodiments, the photolithography apparatus 18 can be implemented to transfer an image onto a substrate, where the substrate can be either a wafer or a flat panel display, for example.

In embodiments, the photolithography apparatus 18 includes wafer positioning stage 52 having a wafer stage 51, a base 1, a following stage base 3A, and an actuator 6. The wafer stage 51 comprises a wafer chuck 74 that holds a wafer W and an interferometer mirror IM. The base 1 is supported by a plurality of isolators 54. The following stage base 3A is supported by a wafer stage frame (reaction frame) 66. The actuator 6 is supported on the ground G through a reaction frame 53. The wafer positioning stage 52 is structured so that it can move the wafer stage 51 in multiple (e.g., three to six) degrees of freedom under precision control by a drive control unit 60 and system controller 62, and position the wafer W at a desired position and orientation relative to the optical elements 16. In this embodiment, the wafer stage 51 has six degrees of freedom by utilizing the Z direction forces generated by the x motor and the y motor of the wafer positioning stage 52 to control a leveling of the wafer W. However, a wafer table having three degrees of freedom (z, $\checkmark_x$, $\checkmark_y$) or six degrees of freedom can be attached to the wafer stage 51 to control the leveling of the wafer. The wafer table includes the wafer chuck 74, at least three voice coil motors (not shown), and bearing system. The wafer table is levitated in the vertical plane by the coil motors and supported on the wafer stage 51 by the bearing system so that the wafer table can move relative to the wafer stage 51.

An illumination system 42 is supported by a frame 72. The illumination system 42 projects radiant energy (e.g., light) through a mask pattern on a reticle R that is supported by and scanned using a reticle stage RS. The reaction force generated by motion of the reticle stage RS can be mechanically released to the ground through a reticle stage frame 48 and the isolator 54, in accordance with the structures described in U.S. Pat. No. 5,874,820, the entire contents of which are incorporated by reference herein. The light is focused through the optical elements 16 supported on a projection optics frame 50 and released to the ground through isolator 54.

An interferometer 56 is supported on the projection optics frame 50 and detects the position of the wafer stage 51 and outputs the information of the position of the wafer stage 51 to the system controller 62. The system controller 62 can include the predictive modeling component of the present invention. A second interferometer 58 is supported on the projection optics frame 50 and detects the position of the reticle stage RS and outputs the information of the position to the system controller 62. The system controller 62 controls a drive control unit 60 to position the reticle R at a desired position and orientation relative to the wafer W or the optical elements 16. In the embodiments of the present invention, the projections optics frame 50 is mounted to the ground utilizing supporting devices.

There are a number of different types of photolithographic devices. For example, apparatus (lithographic tool) 18 may comprise an exposure apparatus that can be used as a scanning type photolithography system which exposes the pattern from reticle R onto wafer W with reticle R and wafer W moving synchronously. Alternately, the apparatus 18 can be a step-and-repeat type photolithography system that exposes reticle R while reticle R and wafer W are stationary.

In any event, the use of apparatus 18 described herein is not limited to a photolithography system for semiconductor manufacturing. The apparatus 18 (e.g., an exposure apparatus), for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, machine tools, metal cutting machines, and inspection machines.

In the illumination system 42, the illumination source can be g-line (436 nm), i-line (365 nm), KrF excimer laser (248 nm), ArF excimer laser (193 nm) and $F_2$ laser (157 nm). Alternatively, the illumination source can also use charged particle beams such as x-ray and electron beam. For instance, in the case where an electron beam is used, thermionic emission type lanthanum hexaboride ($LaB_6$) or tantalum (Ta) can be used as an electron gun. Furthermore, in the case where an electron beam is used, the structure could be such that either a mask is used or a pattern can be directly formed on a substrate without the use of a mask.

With respect to the optical elements 16, when far ultraviolet rays such as the excimer laser is used, glass materials such as quartz and fluorite that transmit far ultra-violet rays are preferably used. When the $F_2$ type laser or x-ray is used, the optical elements 16 should preferably be either catadioptric or refractive (a reticle should also preferably be a reflective type), and when an electron beam is used, electron optics should preferably comprise electron lenses and deflectors. The optical path for the electron beams should be in a vacuum.

Also, with an exposure device that employs vacuum ultraviolet radiation (VUV) of wavelength 200 nm or lower, use of the catadioptric type optical system can be considered. Examples of the catadioptric type of optical system include U.S. Pat. No. 5,668,672, as well as U.S. Pat. No. 5,835,275. In these cases, the reflecting optical device can be a catadioptric optical system incorporating a beam splitter and concave mirror. U.S. Pat. No. 5,689,377 as well as U.S. Pat. No. 5,892,117 also use a reflecting-refracting type of optical system incorporating a concave mirror, etc., but without a beam splitter, and can also be employed with this invention. The disclosures in the above-mentioned U.S. patents are incorporated herein by reference in their entireties.

As described above, a photolithography system according to the above described embodiments can be built by assembling various subsystems in such a manner that prescribed mechanical accuracy, electrical accuracy and optical accuracy are maintained. In order to maintain the various accuracies, prior to and following assembly, every optical system is monitored and, if necessary, adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems.

Once a photolithography system is assembled using the various subsystems, total adjustment is performed to make sure that every accuracy is maintained in the complete photolithography system. Additionally, it is desirable to manufacture an exposure system in a clean room where the temperature and humidity are controlled.

Moreover, once the system is running, the various subsystems are monitored. In accordance with the invention, for example, the optical elements 16 are monitored to ensure that power illumination is maintained at a desired level. For example, any well known sensor can be implemented to measure power illumination at a wafer surface. The power illumination can then be provided to the predictive modeling component 14 for predictive modeling in accordance with the invention. Periodic maintenance and scheduling thereof may be performed, based on the predictive modeling of the present invention. Additionally, amongst other features discussed herein, catastrophic failures can be more accurately predicted, thereby ensuring optimal performance of the lithographic tool and reduced downtime.

Although the invention has been particularly discussed in a photolithography system as an exemplary example, the inventive products, methods and systems may be used in other and further contexts, including any applications where it is desired to reduce or minimize vibrations, such as precision apparatuses (e.g., photography systems).

Figure 11:
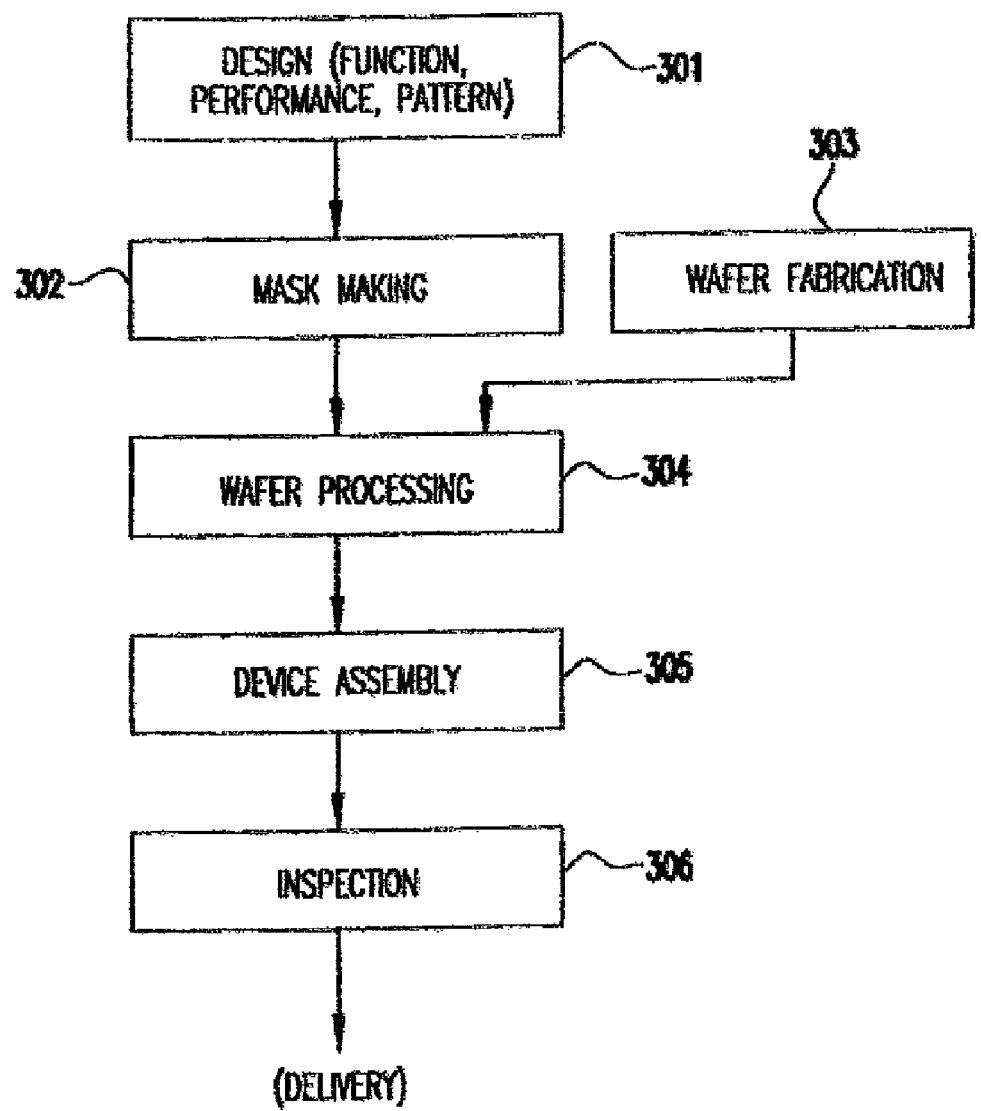
FIGS. 11 and 12 show illustrative flow diagrams representative of semiconductor devices fabrication processes.

Further, semiconductor devices can be fabricated using the above described systems, by the process shown generally in FIG. 11. In step 301 the device's function and performance characteristics are designed. Next, in step 302, a mask (reticle) having a pattern is designed according to the previous designing step, and in a parallel step 303, a wafer is made from a silicon material. The mask pattern designed in step 302 is exposed onto the wafer from step 303 in step 304 by a photolithography system described hereinabove consistent with the principles of the present invention. In step 305 the semiconductor device is assembled (including the dicing process, bonding process and packaging process), then finally the device is inspected in step 306.

Figure 12:
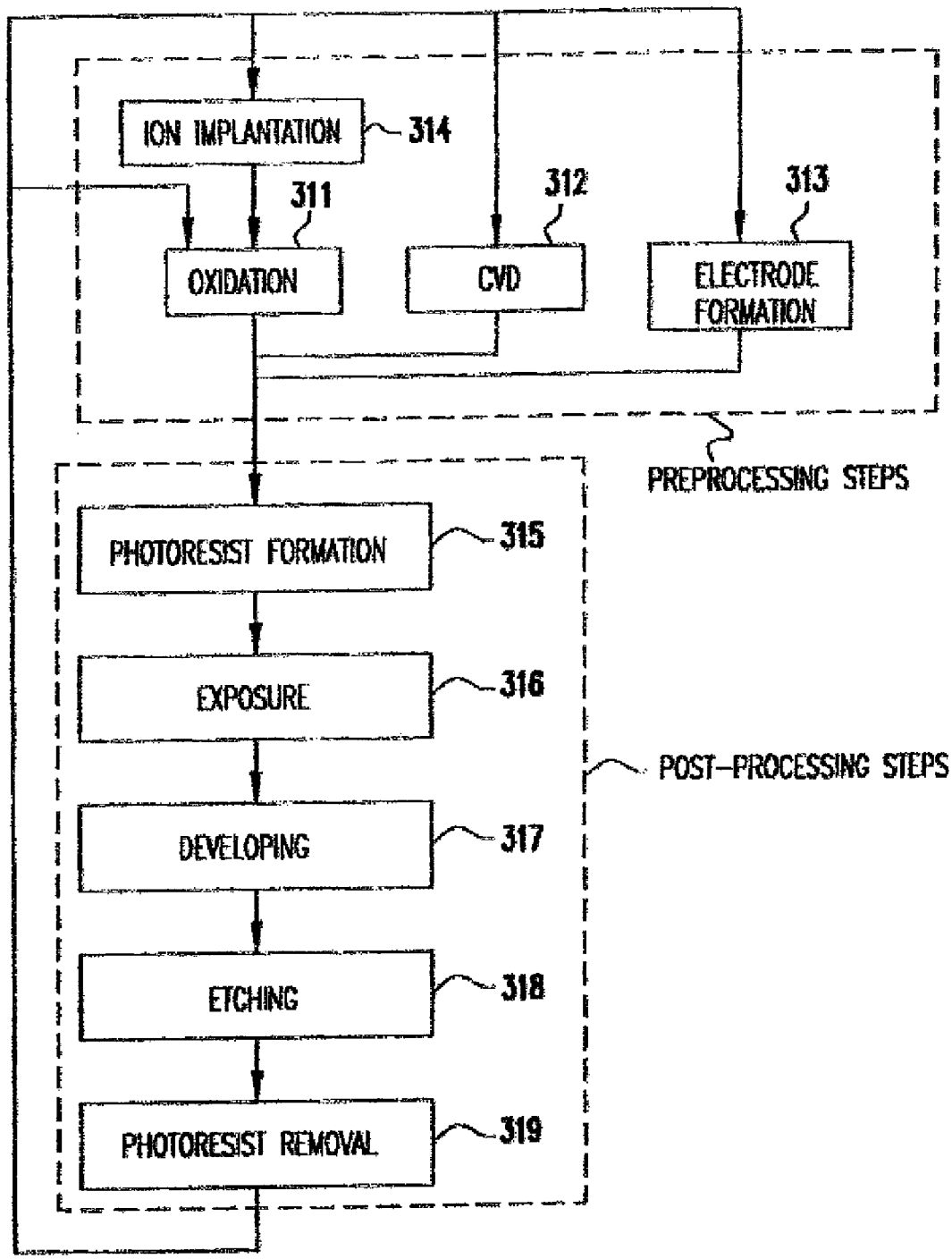

FIG. 12 illustrates a detailed flowchart example of the above-mentioned step 304 in the case of fabricating semiconductor devices. In step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The above-mentioned steps 311-314 form the preprocessing steps for wafers during wafer processing, and selection is made at each step according to processing requirements.

At each stage of wafer processing, when the above-mentioned preprocessing steps have been completed, the following post-processing steps are implemented. During post-processing, initially in step 315 (photoresist formation step), photoresist is applied to a wafer. Next, in step 316 (exposure step), the above-mentioned exposure apparatus is used to transfer the circuit pattern of a mask (reticle) to a wafer. Then, in step 317 (developing step), the exposed wafer is developed, and in step 318 (etching step), parts other than residual photoresist (exposed material surface) are removed by etching. In step 319 (photoresist removal step), unnecessary photoresist remaining after etching is removed. Multiple circuit patterns are formed by repetition of these pre-processing and post-processing steps.

While the invention has been described in terms of embodiments, those skilled in the art will recognize that the invention can be practiced with modification within the spirit and scope of the appended claims.

It is claimed:

1. A subsystem for an apparatus comprising at least one module configured to analyze data associated with power illumination at a surface, and make predictions based on a fitted curve of analyzed data using an exponentially based decay model, wherein the at least one module is configured to determine an accelerated degradation of power illumination of a lithographic tool based on the predictions.

2. The subsystem of claim 1, wherein the exponential based decay model is a non-linear model.

3. The subsystem of claim 1, wherein the exponentially based decay model establishes the predictions from actual mathematical trends.

4. The subsystem of claim 1, wherein the at least one module decides which prediction equation to use based on a signature shape of the analyzed data.

5. The subsystem of claim 1, wherein the at least one module is configured to provide a display of the fitted curve to the analyzed data.

6. The subsystem of claim 1, wherein the at least one module provides advanced notice for parts acquisition, advance notice to schedule recovery tasks and/or proactive and data driven recovery of optical elements of a lithographic tool based on the predictions.

7. The subsystem of claim 1, wherein the at least one module includes computer code stored in at least one of internally in the at least one module, temporarily or permanently in a memory and storage system.

8. The subsystem of claim 1, wherein the at least one module is configured to transmit at least the data associated with the predictions over a network.

9. The subsystem of claim 1, wherein the exponentially based decay model is defined initially as:

$$P_f = P_o e^{\beta(x[t])}$$

where, $P_f$ is defined as a final power, $P_o$ is defined as an initial power, $\beta$ defines a constant attenuation coefficient and x(t) defines an accumulation as a function of an independent variable t, and [$\beta$x(t)] defines an exponential growth term.

10. The subsystem of claim 1, wherein the exponentially based decay model computes:
(i) transmitted power in (mW) at any point along a trend by:

$$P_f = P_o e^{(\alpha_o p + 1/2 \alpha' p^* p)}$$

(ii) power rate in (mW/BP) at any point along the trend by:

$$P_f' = P_f (\alpha_o + \alpha' p)$$

(iii) power acceleration (mW/BP$^2$) at any point along the trend by:

$$P_f'' = P_f (\alpha_o^2 + \alpha' + 2\alpha_o \alpha' p + \alpha'^2 p^2)$$

wherein acceleration is normally positive and is representative of an acceleration of the degradation of an optical element.

11. The subsystem of claim 10, wherein the predictions are transposed into the fitted curve which assumes:
a slightly upwardly facing concave curve when degradation of the optical element is normal, and
a downwardly facing concave curve when there is an accelerated degradation of the optical element.

12. The subsystem of claim 1, wherein the analyzed data associated with power illumination at a surface is a region of power vs. pulse count data.

13. The subsystem of claim 12, wherein the at least one module is configured to remove discontinuities over the region to produce a smoothed dataset and uses the smoothed dataset to determine point to point slopes resulting in average ("constant") acceleration rate ($\alpha'$) over the region and average loss rate ($\alpha_{average}$) at a mid-point of a pulse range.

14. The subsystem of claim 13, wherein the at least one module calculates a take-off rate ($\alpha$) at a final pulse in the data using the exponentially based decay model.

15. The subsystem of claim 14, wherein the exponentially based decay model uses equation $\alpha = \alpha_{average} + \alpha'(p_{last} - p_{first})/2$ to calculate the take-off rate ($\alpha$).

16. The subsystem of claim 14, wherein the at least one module further calculates a number of additional pulses (p) by $P_f = P_o e^{(\alpha_o p + 1/2 \alpha'' p^* p)}$.

17. The subsystem of claim 1, wherein the exponentially based decay model is used to calculate an acceleration of degradation of an optical element.

18. The system subsystem of claim 17, wherein the at least one module is configured to implement a polynomial equation to implement maintenance procedures in case of a predicted catastrophic failure.

19. A method for predicting degradation issues with an optical system, comprising:
providing a computer infrastructure being operable to:
analyze region of power vs. pulse count data;
remove discontinuities over the region to produce a smoothed dataset;
determine point to point slopes of the dataset; and
calculate a take-off ($\alpha$) at final pulse in the dataset.

20. The method of claim 19, wherein the computer infrastructure is operable to calculate the take-off rate using $\alpha = \alpha_{average} + \alpha'(p_{last} - p_{first})/2$.

21. The method of claim 19, wherein the computer infrastructure is operable to calculate a number of additional pulses (p) needed before power reaches a lower limit.

22. The method of claim 21, wherein the computer infrastructure is operable to calculate the number of additional pulses by $P_f = P_o e^{(\alpha_o p + 1/2 \alpha'' p^* P)}$.

23. The method of claim 19, wherein the determining of the point to point slopes results in two values.

24. The method of claim 23, wherein the two values include: average ("constant") acceleration rate ($\alpha'$) over a region and average loss rate ($\alpha_{average}$) at a mid-point of a pulse range.

25. The method of claim 19, wherein the analyzing the region of power vs. pulse count data is over a predetermined amount of time.

26. The method of claim 19, wherein point to point slopes result in a curve plotted as power (mW/cm$^2$) vs. time (pulse count per billion).

27. A method of predicting degradation of an optical element, comprising:
analyzing data associated with power illumination over a predetermined period of time;
modeling the analyzed data using a non-linear modeling technique; and
displaying results of the modeling on a display, wherein the displayed results include a curve fit to the analyzed data, and the curve is based on an actual shape of degradation signature.

28. The method of claim 27, wherein the non-linear modeling technique is an exponential decay modeling based on:

$$P_f = P_o e^{\beta(x[t])}$$

where, Pf is defined as final power, $P_o$ is defined as initial power, $\beta$ defines a constant attenuation coefficient and x(t) defines an accumulation as a function of an independent variable t.

29. The method of claim 28, wherein an accelerated degradation of the optical element is found using a 2$^{nd}$ derivative of $P_f = P_o e^{\beta(x[t])}$.

30. The method of claim 27, wherein a normal degradation of illumination power shows a slope trending positive through time and an accelerating degradation of power illumination shows a slope trending negative through time.

31. The method of claim 27, wherein the non-linear modeling technique establishes predictions from actual mathematical trends.

32. The method of claim 31, further comprising selecting a prediction equation based on a signature shape of the analyzed data.

33. The method of claim 27, further comprising providing data and the result over a network.

34. The method of claim 27, further comprising determining an accelerated degradation of power illumination of a lithographic tool based on a shape of the displayed results.

35. The method of claim 27, wherein the non-linear modeling technique is based on an exponentially based decay model defined initially as:

$$P_f = P_o e^{\beta(x[t])}$$

where, $P_f$ is defined as a final power, $P_o$ is defined as an initial power, $\beta$ defines a constant attenuation coefficient and x(t) defines an accumulation as a function of an independent variable t, and $\beta$x(t) defines an exponential growth term.

36. The method of claim 35, wherein the exponentially based decay model computes:
(i) transmitted power in (mW) at any point along a trend by:

$$P_f = P_o e^{(\alpha_o p + 1/2 \alpha' p^* p)}$$

(ii) power rate in (mW/BP) at any point along the trend by:

$$P_f' = P_f (\alpha_o + \alpha' p)$$

(iii) power acceleration (mW/BP$^2$) at any point along the trend by:

$$P_f''=P_f(\alpha_o^2+\alpha'+2\alpha_o\alpha'p+\alpha'^2p^2)$$

wherein acceleration is normally positive and is representative of an acceleration of degradation of an optical element.

37. An exposure apparatus, comprising:
an optical subsystem for image transfer of radiant energy from an illumination system onto a substrate;
a sensor to detect power illumination at a surface of the substrate; and
at least one module configured to analyze data associated with the power illumination, and to fit a non-linear curve to the analyzed data to obtain predictive information, wherein the at least one module is configured to determine an accelerated degradation of power illumination of a lithographic tool based on a shape of the curve.

38. The exposure apparatus of claim 37, wherein the at least one module is configured to use an exponentially based decay model for fitting the curve to the analyzed data.

39. The exposure apparatus of claim 38, wherein the exponentially based decay model establishes predictions from actual mathematical trends.

40. The exposure apparatus of claim 37, wherein the at least one module decides which prediction equation to use based on a signature shape of the analyzed data.

41. The exposure apparatus of claim 37 using an exponentially based decay model to analyze the data which is configured to compute:

(i) transmitted power at any point along a trend by:

$$P_f=P_o e^{(\alpha_o p+1/2\alpha' p*p)}$$

(ii) power rate at any point along the trend by:

$$Pf'=Pf(\alpha_o+\alpha'p)$$

(iii) power acceleration at any point along the trend by:

$$Pf''=Pf(\alpha_o^2+\alpha'+2\alpha_o\alpha'p+\alpha'^2p^2)$$

wherein acceleration is normally positive and is representative of an acceleration of the degradation of an optical element.

42. The exposure apparatus of claim 37, wherein the curve assumes:
a slightly upwardly facing concave curve when degradation of the optical element is normal, and
a downwardly facing concave curve when there is an accelerated degradation of the optical element.

43. The exposure apparatus of claim 37, wherein the substrate is used to produce a desired microelectronic device or a flat panel display.

* * * * *